United States Patent [19]

Briney et al.

[11] Patent Number: 4,485,167

[45] Date of Patent: Nov. 27, 1984

[54] AQUEOUS DEVELOPABLE PHOTOPOLYMERIZABLE ELEMENTS

[75] Inventors: Gary C. Briney; Stephen J. Fuerniss, both of Sayre, Pa.

[73] Assignee: E. I. Du Pont de Nemours and Company, Wilmington, Del.

[21] Appl. No.: 392,795

[22] Filed: Jun. 28, 1982

Related U.S. Application Data

[63] Continuation of Ser. No. 193,919, Oct. 6, 1980, abandoned.

[51] Int. Cl.$^3$ .............................................. G03B 1/68
[52] U.S. Cl. ..................................... 430/281; 430/277; 430/910; 430/916; 204/159.15; 204/159.16; 204/159.23
[58] Field of Search ............... 430/910, 281, 277, 916; 204/159.15, 159.16, 159.23

[56] References Cited

U.S. PATENT DOCUMENTS

| | | | |
|---|---|---|---|
| 3,765,898 | 10/1973 | Bauer et al. | 430/281 |
| 3,793,033 | 2/1974 | Mukherjee | 204/159.11 |
| 3,802,889 | 4/1974 | Skarvinko | 430/283 |
| 3,804,631 | 4/1974 | Faust | 430/281 |
| 3,827,908 | 8/1974 | Johnson et al. | 430/271 |
| 3,868,254 | 2/1975 | Wemmers | 430/300 |
| 4,092,170 | 5/1978 | Houtermans | 430/300 |
| 4,142,892 | 3/1979 | Paal | 430/5 |
| 4,273,857 | 6/1981 | Leberzammer | 430/281 |

FOREIGN PATENT DOCUMENTS 1042520  9/1966  United Kingdom .

*Primary Examiner*—Jack P. Brammer

[57] ABSTRACT

An aqueous developable photopolymerizable element having improved rate of development consisting essentially of (a) an ethylenically unsaturated monomeric compound, (b) an organic acidic polymeric binder, (c) a photoinitiator or photoinitiator system and (d) at least 2% by weight based on weight of solids of an organic compound or salt of an organic compound as defined. The elements are useful as photoresists, printing plates and for preparation of proofs and litho masks.

6 Claims, No Drawings

AQUEOUS DEVELOPABLE PHOTOPOLYMERIZABLE ELEMENTS

This is a continuation of application Ser. No. 193,919 filed Oct. 6, 1980, now abandoned.

TECHNICAL FIELD

This invention relates to aqueous developable photopolymerizable elements. More particularly this invention relates to aqueous developable photopolymerizable elements having improved rates of development.

BACKGROUND ART

Aqueous developable photopolymerizable compositions are becoming of increased importance in the preparation of dry photoresist elements as well as in the preparation of photopolymerizable elements useful for printing, proofing, etc. Many of the photopolymerizable elements, in order to achieve high physical strength, utilize high molecular weight polymeric binders in their photopolymerizable compositions. It has been found that such elements may compromise speed of development. To increase the productivity of such elements would require excessively large processors. It is known that developers for aqueous developable photopolymerizable elements undergo loss of activity upon use and aging, as do developers from other arts, e.g., silver halide developers. To compensate for this loss of activity by photopolymer developers, various apparatus such as replenishment machines with their accompanying replenishment compositions have been devised. Replenishment machines are expensive and the operation of the machines increases the expense in that replenisher solutions must be purchased and the operator compensated for his time.

It is therefore desirable to prepare aqueous developable photopolymerizable elements which exhibit improved, i.e., quicker development, in standard developer solutions without affecting the physical properties of the dry photopolymerizable layer of the element, e.g., tensile strength, photopolymerization speed, adhesion to surfaces such as metal, e.g., copper; film, etc., and little or substantially no effect on the aqueous developers for the dry photopolymer layer.

DISCLOSURE OF THE INVENTION

In accordance with this invention there is provided an aqueous developable photopolymerizable element comprising a support bearing at least one layer of a photopolymerizable composition consisting essentially of (a) at least one nongaseous ethylenically unsaturated compound capable of forming a high polymer by free-radical initiated chain propagating addition polymerization;

(b) at least one organic acidic polymeric binder;

(c) an organic, radiation-sensitive, free radical generating photoinitiator or photoinitiator system, and (d) at least 2.0% by weight based on the weight of solids in the photopolymerizable composition of an organic compound or salt of an organic compound taken from the group consisting of (1) $R(OCH_2CH_2)_n$—OH wherein R is an alkyl chain with 13 to 18 carbon atoms or $(CH_3(CH_2)_7$—$CH=CH(CH_2)_8$—, and n is 2 to 10;

(2)

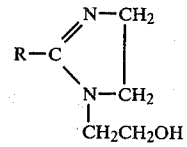

wherein R is an alkyl chain with 7 to 17 carbon atoms, (3)

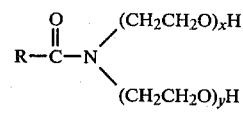

wherein R is $CH_3(CH_2)_7CH=CH(CH_2)_8$—, or a mixture of alkyl chains with 16 and 18 carbon atoms and $CH_3(CH_2)_7CH=CH(CH_2)_8$—, and $x+y$ is 2 to 10;

(4)

$$Na^+O_3^-S-CHCO_2R$$
$$\phantom{Na^+O_3^-S-}CH_2CO_2R$$

wherein R is a straight or branched alkyl chain of 8 to 13 carbon atoms;

(5)

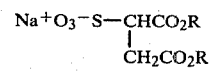

wherein R is an alkyl chain with 1 to 9 carbon atoms;

(6)

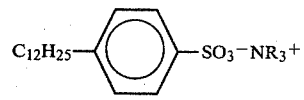

wherein n is 10 to 50;

(7)

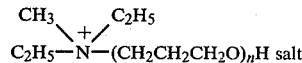

[$C_{16}H_{33}N(CH_3)_3^+$]$Br^-$; (8)

$RNHCH_2CH_2COO^-Na^+$ (9)

wherein R is an alkyl group derived from coconut oil, and combinations thereof.

The aqueous developable photopolymerizable elements of this invention contain many components, described more fully below, which are common in photopolymerizable elements disclosed in the prior art. These components include: the ethylenically unsaturated compound capable of addition polymerization (monomer), organic acidic polymeric binder, and photoinitiator or photoinitiator system. Other additives that may be present include: thermal polymerization inhibitors, adhesion promoters, plasticizers, sensitizers, dyes, chelating agents, etc., commonly used in photopolymerizable compositions used to form the photosensitive layer of a photopolymerizable element. The term "consisting essentially of" does not exclude these and other additives or components which do not prevent the advantages of the invention from being realized. The photopolymerizable composition is present on a suitable support, e.g., a film or metal support. A protective cover sheet may be present on the side of the photopolymerizable layer opposite that of the support.

The photopolymerizable element has present in its photopolymerizable layer at least 2% by weight based on the weight of solids in the layer of at least one organic compound or salt of an organic compound as defined above. It is desirable that the organic compound or organic salt compound be present in the least amount possible to achieve the advantages of this invention. The organic compound or organic salt compound is generally present in no more than about 20% by weight of solids, preferably about 4 to 10% by weight of solids.

Compounds from the following types are useful, e.g., nonionic, anionic, cationic and amphoteric. Not all organic compounds or organic salt compounds provide the improved results achieved by the compounds of the invention. For example, some of the compounds tested in the examples below do not provide an improved rate of development. Some organic compounds provide improved results only in used developer as defined below. Other compounds provide improved results in both used developer and fresh developer, as defined below. Those organic compounds which show improved results in fresh developer generally show improved results in used developer also.

Illustrative of organic compounds or salts of organic compounds tested in the photopolymerizable composition are as follows.

Nonionic Type (1) (a) $C_{13}H_{27}(OCH_2CH_2)_6$—OH
(1) (b) $C_{18}H_{37}(OCH_2CH_2)_2$—OH
(1) (c) $C_{18}H_{37}(OCH_2CH_2)_{10}$—OH
(1) (d) $CH_3(CH_2)_7CH=CH$—$(CH_2)_8$—$(OCH_2CH_2)_{10}$—OH (2)

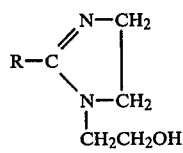

wherein R includes (a) $C_7H_{15}$(mol. wt. 212), (b) $C_{12}H_{25}$(mol. wt. 282), (c) $C_{17}H_{35}$(mol. wt. 345) or (d) $C_{17}H_{35}$(mol. wt. 350).

(3) (a)

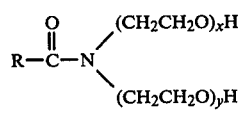

wherein x+y is 5 and R is oleyl (mol. wt. 498)
(3) (b)

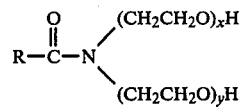

wherein X+Y is 5 and R is a straight chain alkyl group derived from hydrogenated tallow (mol. wt. 500)
(3) (c)

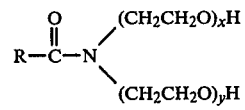

wherein X+Y is 5 and R is a straight chain alkyl group derived from hydrogenated tallow (mol. wt. 2478)
(3) (d)

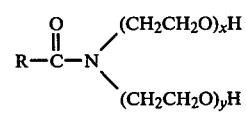

wherein x+y is 10 and R is a straight chain alkyl group derived from tallow.

Anionic Type (4)

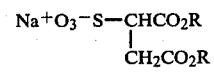

wherein R is either (a) $C_4H_9$(isobutyl), (b) $C_5H_{11}$(amyl), (c) $C_6H_{11}$(cyclohexyl), (d) $C_6H_{13}$(hexyl), (e) $C_8H_{17}$(octyl), particularly 2-ethylhexyl, or (f) $C_{13}H_{27}$(tridecyl)

(5)

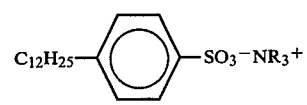

wherein R is alkyl chain of 1 to 9 carbon atoms, Witconate® 10-59 manufactured by Witco Chemical Co., New York, N.Y.

Cationic Type (6)

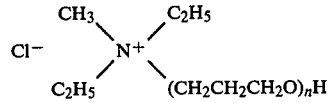

wherein n includes (a) 25 (mol. wt. 1600), (b) 41 (mol. wt. 2500), or (c) 9 (mol. wt. 600).
(7) Benzyltrimethylammonium hydroxide
(8) Hexadecyltrimethylammonium bromide

Amphoteric Type (9) $RNHCH_2CH_2COO^-Na^+$ wherein R is an alkyl group derived from coconut oil.

The aqueous developable photopolymerizable elements can be either positive-working or negative-working. Positive-working elements are disclosed in Deuber U.S. Pat. No. 4,162,162, which is incorporated by reference, particularly Example 7 wherein a double exposure is used, and Pazos U.S. Pat. No. 4,198,242, which is incorporated by reference, particularly Example 27 wherein a nitroaromatic composition is disclosed in the photopolymerizable composition. Negative-working elements are disclosed, for example in U.S. Pat. No. 3,458,311 and in U.S. application Ser. No. 66,374, filed Aug. 14, 1979, now U.S. Pat. No. 4,273,857. These dry photopolymerizable layers are developable in an aqueous alkali solution, e.g., 1 weight % $Na_2CO_3.H_2O$ at 40° C. for 30 to 90 seconds at a spray pressure of 20 psi ($1.4 \times 10^6$ dynes/cm$^2$).

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethylacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

Particularly preferred as binders are acidic, polymeric, organic compounds since the photopolymerizable composition resulting is developable in solely aqueous alkaline solvent devoid of organic solvents. Single or multiple binder compounds can be used. One class of film-forming binders which is soluble in aqueous alkaline media and is useful in the compositions of the present invention is vinyl addition polymers containing free carboxylic acid groups, which are prepared from 30 to 94 mole percent of one or more alkyl acrylates and 70 to 6 mole percent of one or more alpha-beta-ethylenically unsaturated carboxylic acids, and more preferably prepared from 61 to 94 mole percent of two alkyl acrylates and 39 to 6 mole percent of an alpha-beta-ethylenically unsaturated carboxylic acid. Suitable alkyl acrylates for use in preparing these polymeric binders include methyl acrylate, ethyl acrylate, propyl acrylate, butyl acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German Application, OS No. 2,320,849, published 11/8/73.

The advantages of using acidic binders can also be obtained by selecting a preformed, compatible macromolecular polymeric binding agent which is a copolymer of (1) a styrene-type of a vinyl monomer and (2) an unsaturated carboxyl-containing monomer, as described in detail in British Pat. No. 1,361,298.

Another photopolymerizable composition is obtained by using a preformed, compatible macromolecular polymeric binding agent mixture, the components thereof taken from two selected classes. The use of the mixtures as described in U.S. Ser. No. 66,324, filed Aug. 14, 1979, eliminates the need for organic solvents in developing. These are mixtures of two types of binders. The first type is preferably selected from a copolymer of vinyl acetate and crotonic acid; a terpolymer of ethyl acrylate, methyl methacrylate, and acrylic acid; and cellulose acetate succinate. The second type is preferably selected from toluene sulfonamide formaldehyde; a copolymer of methyl methacrylate and methacrylic acid; a terpolymer of methyl methacrylate, ethyl arylate, and hydrogen maleate; a terpolymer of vinyl chloride, vinyl acetate, and maleic acid; a copolymer of styrene and maleic anhydride; and a terpolymer of methyl methacrylate, ethyl acrylate, and methacrylic acid.

The photopolymerizable composition contains binder in amounts of 90 to 40 parts by weight with the monomeric compound(s) present in amounts of 10 to 60 parts by weight. More than one binder can be used.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoinitiators and photoinhibitors are sensitizers disclosed in U.S. Pat. No. 4,162,162. The initiator is present in 0.1 to 10%, preferably 0.2 to 5% by weight of the entire photopolymerizable layer.

The composition of the invention preferably also contains an inhibitor to prevent thermal polymerization of the photopolymerizable system.

Thermal polymerization inhibitors that can be used in photopolymerizable compositions include: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982.

Various dyes and pigments may also be added to increase the visibility of the resist image. Any colorant used, however, should preferably be transparent to the actinic radiation used, although they may be opaque or strongly absorb other radiation in the visible or U.V. spectral region.

Other additives present in the photopolymerizable layer include: nonpolymerizable plasticizers, e.g., dioctyl phthalate, triethylene glycol diacetate, poly(ethylene/propylene)glycol (mol. wt. 3200), tricresyl phosphate, etc.

The photopolymerizable elements can be prepared by coating the photopolymerizable compositions onto substrates in accordance with usual coating practices. Suitable coating solvents include: methyl ethyl ketone, methylene chloride, dimethyl formamide, aqueous ammonia, water, etc. By "substrates" is meant any natural or synthetic support, preferably one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include alumina-blasted aluminum, anodized aluminum, polyethylene terephthalate film, e.g., resin-subbed polyethylene terephthalate film, polyvinyl alcohol-coated paper, crosslinked polyester-coated paper, nylon, glass, cellulose acetate film, heavy paper such as lithographic paper, and the like.

The particular substrate will generally be determined by the use application involved. For example, when printed circuits are produced, the substrate may be a plate which is a copper coating on fiberboard; in the preparation of lithographic printing plates, the substrate is anodized aluminum.

Preferably the layer of the photopolymerizable compositions have a thickness ranging from about 0.0001 inch (2.5 $\mu$m) to about 0.01 inch (250 $\mu$m) and are adhered with low to moderate adherence to a thin, flexible, polymeric film support which may transmit radiation actinic to the photopolymerizable layer. The opposite side of the photopolymerizable layer may have adhered thereto a protective cover layer or cover sheet wherein the sheet has less adherence to the layer than the adherence between the film support and the layer. A particularly preferred support is a transparent polyethylene terephthalate film having a thickness of about 0.001 inch ($\sim$0.0025 cm). Polyethylene, 0.001 inch ($\sim$0.0025 cm) is a preferred cover sheet; polyvinyl alcohol coating is a preferred cover layer.

The photopolymerizable element is exposed to actinic radiation. The exposure may be by means of a light source which is rich in ultraviolet radiation through a halftone image transparency, e.g., process negative or positive (an image-bearing transparency consisting solely of substantially opaque and substantially transparent areas where the opaque areas are substantially of the same optical density). The transparency may also have a line image such as engineering drawings or in the form of a circuit. The image or transparency may or may not be in contact with the surface of the element, i.e., contact exposure or projection exposure. For exposures through transparent film supports, the time required will range from a few seconds to several minutes, depending on the intensity of the exposing radiation and the inherent photographic speed of the composition. After exposure, the cover sheet or sheet support through which the element was exposed is removed, and the exposed layer with its hardened areas and its unhardened areas is developed by removal of the latter from element. The removal of the unhardened areas may be accomplished by treating the side of the element which was exposed with the developer solution, thereby washing out the unexposed areas. Alternatively, if an overcoat layer is present instead of a cover sheet, the developer for the unexposed photopolymerizable layer will remove the overcoat layer completely above the unexposed areas and at least partially above the exposed areas.

Since free-radical generating initiators activatable by actinic radiation generally exhibit their maximum sensitivity in the ultraviolet range, the radiation source should usually furnish an effective amount of this radiation. Both point and broad radiation sources are effective. Such sources include carbon arcs, xenon arcs, mercury vapor arcs, fluorescent lamps with ultraviolet radiation emitting phosphors, argon glow lamps, electronic flash units and photographic flood lamps. A tungsten 1000 W quartz iodide lamp is also suitable. The mercury-vapor arcs are customarily used at a distance of 3.8–61 cm from the photopolymerizable layer. The point sources are generally used at a distance of 50–500 cm from the element. It is noted, however, that in certain circumstances it may be advantageous to expose with visible light, using a photoinitiator sensitive in the visible region of the spectrum. In such cases, the radiation source should furnish an effective amount of visible radiation. Many of the radiation sources listed above furnish the required amount of visible light.

After exposure, the element is developed, e.g., by washing out with an aqueous developer the unhardened portions of the photopolymerizable layer on the side of the layer that was exposed. This may be carried out by impingement of spray jets, with agitated immersion, brushing or scrubbing.

The aqueous developable photopolymerizable compositions are developed with aqueous bases, i.e., aqueous solutions of water-soluble bases in concentrations generally in the range of 0.01% to 2% by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; ammonium hydroxide and tetra-substituted ammonium hydroxides, e.g., tetramethyl-, tetraethyl-, trimethylbenzyl-, and trimethylphenylammonium hydroxides, sulfonium hydroxides, e.g., trimethyl-, diethylmethyl, dimethylbenzyl-, sulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

BEST MODE FOR CARRYING OUT THE INVENTION

The best mode for carrying out the invention is illustrated in Example 23 wherein the organic compound is sodium bis-(2-ethylhexyl) sulfosuccinate.

INDUSTRIAL APPLICABILITY

The aqueous developable photopholymerizable elements of this invention are useful in the preparation of dry photoresists having improved developability rates. The photoresists are particularly useful for tenting of through-holes in circuit boards for making multilayer photocircuits. The photopolymerizable elements are also useful for the preparation of aqueous developable printing plates, e.g., of the relief (letterpress) or lithographic types. Additional uses for the photopolymerizable elements are in the preparation of photopolymer litho films which are dot-etchable such as are used in making proofs and litho masks as shown in U.S. Pat. No. 4,173,673.

EXAMPLES

The following examples illustrate the invention wherein the percentages and parts are by weight.

The developers used in Examples 2 to 22 set forth below are of varying age/use characteristics. A measure of this is the range of clearing times (time to completely washout or develop the unexposed image areas of the exposed element) observed in control elements having no added organic compound or organic salt compound of this invention. Fresh and used developers employed with controlled elements are designated as follows for purposes of this invention. Fresh developers in these examples have short clearing times, i.e., less than 90 seconds. Used developers in these examples have relatively longer clearing times, i.e., 90 seconds or more.

EXAMPLE 1

Overcoat Formulation

Starch Dispersion

A. In a 1-liter stainless steel beaker is slurried:
Rice starch, 84.8 g, Remy ® Type B6 Neutral, particle size in water dispersion, 4 to 6 μm, Celanese Corp., New York, N.Y., and
Distilled water, 224.0 g.

B. In a 5-liter stainless steel pot is mixed
Vinol ® 107, 10% solids in water[1], 294.0 g, and Distilled water, 3885.0 g.
The contents of beaker (A) is added to pot (B) rinsing beaker (A) twice with 224.0 g of distilled water, adding the rinse water to pot (B). The mixture is dispersed using a Waring ® blender.

[1]98.0–98.8% hydrolyzed polyvinyl alcohol, Brookfield Model LVF viscosity, 6–8 cps/4% aqueous/20° C./#1 spindle/60 rpm, Air Products and Chemical Co., Inc.

Overcoat Composition

In a 10-liter stainless steel pot are mixed in succession:

| Component | Amount (g) |
|---|---|
| Distilled water | 4275.0 |
| Polyethylene wax/water dispersion Misco Products Co., Wheeling, ILL. | 178.0 |
| Colloidal Silica, Ludox ® AM, aqueous colloidal sol of alumina modified silica particles containing about 30% solids, pH at 25° C. 8.6–9.3, E. I. du Pont de Nemours and Company, Wilmington, DE | 98.5 |
| Vinol ® 107, 10% solids in water, described above | 277.0 |
| Hemiacetal resin, 10% solids in water reaction product of 30.0 g polyvinyl alcohol (Elvanol ® 7102, E. I. du Pont de Nemours and Company, Wilmington, DE) and o-sulfobenzaldehyde (OSB); % reacted OSB is at least 49% | 1108.0 |
| Starch dispersion, described above | 1542.0 |
| Fluorocarbon surfactant, 5% solids in water | 21.1 |

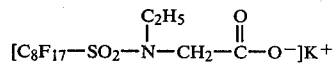

Undercoat Formulation

Pigmented Chips

In a Banbury mixer at 77 r.p.m. is mixed for six minutes from the time the mix temperature reaches 200° C. the following compositions:

| Component | Amount (%) |
|---|---|
| Terpolymer: ethyl acrylate (56), methyl methacrylate (37), acrylic acid (7) | 43.2 |
| Copolymer of styrene/sec. butyl maleate, 1.4/1, (mol. wt. about 20,000) | 10.8 |
| Carbon black, Sterling, N.J. | 45.0 |
| Stearic acid | 1.0 |

The mixture temperature is maintained at 200° C. or less during the mix period. The mix is calendered to 0.025 inch (0.635 mm) thick sheets which are allowed to cool to room temperature and are then broken into small chips by chopping, dicing or granulating.

In a 5-gallon (~19 liter) stainless steel pot is mixed in order the following components:

| Component | Amount (g) |
|---|---|
| Methylene chloride | 11880.0 |
| 2-Ethoxyethanol | 929.0 |
| Copolymer of styrene/sec. butyl maleate, 1.4/1, (mol. wt. about 20,000) (allow to dissolve before proceeding) | 1572.0 |
| Trimethylolpropanetriacrylate | 1267.0 |
| Zinc acetylacetonate complex | 57.6 |
| 2-Ethoxyethanol rinse (slurry these three components and add) | 50.0 |
| 2-Mercaptobenzoxazole | 46.1 |
| Michler's ketone | 132.0 |
| Ethyl Michler's ketone | 132.0 |
| 2,2'-Bis(o-chlorophenyl)-4,4',5,5'-tetraphenylbiimidazole | 499.0 |
| Pigmented chips prepared as described | 1792.0 |

-continued

| Component | Amount (g) |
|---|---|
| above | |

Addition of Organic Compound

To each of four portions of the above-described undercoat formulation, designated A to D, 4400 g each, is added organic compound 4(e) described above, sodium bis-(2-ethylhexyl) sulfosuccinate, in the proportions given in Table I below. These solutions are coated on resin-subbed polyethylene terephthalate film base, 0.004 inch (0.10 mm), having polysilicic acid antistatic compound on the nonsubbed side. The coater is a continuous-web laboratory scale coater and dryer combination. The dry coating thickness is about 20.0 μm. The overcoat is then applied in a similar manner yielding a dry coating thickness of 5.0 μm. The effect of the added organic compound on development clearing time is determined in inches per minute (cm/minute) maximum lineal speed through a continuous washout processor, Crona-Lite ®, E. I. du Pont de Nemours and Company, Wilmington, DE. The clearing rates are set forth below in Table I and are converted as noted therein to normalized clearing times using the relationship:

$$\text{Normalized Clearing Time} = \frac{75}{\text{Measured Clearing Rate}}$$

TABLE I

| | A | B | C | D |
|---|---|---|---|---|
| Weight added organic compound (g) | 0 | 21.1 | 42.2 | 63.3 |
| Weight as percent of total solutes | 0 | 1.52 | 3.00 | 4.44 |
| Clearing Rate (inches/minute) (cm/min) | 75 (190.5) | 90 (228.6) | 110 (279.4) | 120 (304.8) |
| Normalized Clearing Rate | 1.0 | 0.83 | 0.68 | 0.62 |
| Reduction of Clearing Time (%) | 0 | 17.0 | 32.0 | 38.0 |

EXAMPLES 2 TO 22

Dry Film Photopolymer Formulation

Preparation of stock solution

The following ingredients are added in succession to a suitable container, i.e., a stainless steel beaker, with stirring to aid dissolution. Following addition of the polymeric binders, the mixture is stirred until the binder dissolves before addition of more components. The remaining components are then stirred in relatively rapidly.

| Component | Amount (g) |
|---|---|
| Methylene chloride | 170.4 |
| Methanol | 133.6 |
| 2-Ethoxyethanol | 26.4 |
| Styrene/isobutylmaleate 1:1 (mol. wt. about 20,000) | 214.4 |
| Terpolymer: methyl methacrylate (71), ethyl acrylate (17), acrylic acid (12) (mol. wt. about 200,000) | 310.4 |
| 2,2′Bis(o-chlorophenyl)-4,4′,5,5′-tetraphenylbiimidazole | 31.2 |
| 1,4,4-trimethyl-2,3-diazabicyclo-[3.2.2]-non-2-ene-N,N—dioxide | 0.24 |
| Benzotriazole | 3.2 |
| Trimethylolpropanetriacrylate | 176.0 |
| Victoria Green Dye, C.I. Basic Green 4 | 0.24 |
| Tris(4-dimethylaminophenyl)methane | 0.80 |
| Michler's ketone | 1.6 |
| Total | 738.08 |

The above stock solution is divided into aliquots and various proportions of the organic compound or organic salt compound under test and the final monomeric compound, polyoxyethyltrimethylolpropane triacrylate, are then added to the individual aliquots of stock solution. The control contains 62.4 g of the additional monomer to yield a total weight of 800.48 g. In most cases the organic compound replaces a portion of the monomer on a gram-for-gram basis (expressed in percent in Table II). Where indicated, the organic compound is added to a mixture containing its full amount of the final monomer. The solutions are coated onto polyethylene terephthalate film using a 0.010 inch (0.25 mm) doctor knife, are air dried, and are laminated to a 0.001 inch (0.025 mm) polyethylene cover sheet. After removal of the cover sheet the films are hot roll laminated at 210°–220° F. (99°–105° C.) to scrubbed 1-oz/sq. foot (~30 mg/cm$^2$) copper clad panels. The support is removed and the clearing time necessary to dissolve the unexposed image areas from the copper panel is measured visually in a Du Pont Model ADS-24 processor, E. I. du Pont de Nemours and Company, Wilmington, DE., employing a 1% aqueous solution of sodium carbonate monohydrate as the aqueous developer at 105° F. (40° C.).

TABLE II

| Example | Organic Compound | Amount organic compound in solvent-free photopolymer layer (%) | Developer Designation | Clearing Time (sec) | Reduction Clearing Time (%) |
|---|---|---|---|---|---|
| 2 | 1(a) | 0 | used | 202 | — |
| | | 4.0 | | 122.0 | 40.0 |
| | | 0 | fresh | 77.5 | — |
| | | 5.0 | | 63.0 | 19.0 |
| | | 0 | used | 106.5 | — |
| | | 3.0 | | 90.0 | 15.5 |
| | | 5.0 | | 93.5 | 12.2 |
| | | 7.8 | | 83.0 | 22.1 |
| | | 0 | used | 92.5 | — |
| | | 3.0 | | 78.5 | 15.1 |
| | | 5.0 | | 81.0 | 12.4 |
| | | 7.8 | | 71.0 | 23.2 |
| 3 | 1(b) | 0 | used | 106.5 | — |
| | | 3.0 | | 87.5 | 17.8 |
| | | 5.0 | | 78.0 | 26.8 |
| | | 7.8 | | 76.0 | 28.6 |
| | | 0 | used | 92.5 | — |
| | | 3.0 | | 80.0 | 13.5 |
| | | 5.0 | | 75.5 | 18.4 |
| | | 7.8 | | 79.0 | 14.6 |
| 4 | 1(c) | 0 | used | 106.5 | — |
| | | 3.0 | | 98.5 | 7.5 |
| | | 5.0 | | 92.5 | 13.1 |
| | | 7.8 | | 92.5 | 13.1 |
| | | 0 | used | 92.5 | — |
| | | 3.0 | | 83.0 | 10.3 |
| | | 5.0 | | 82.5 | 10.8 |
| | | 7.8 | | 82.0 | 11.4 |
| 5 | 1(d) | 0 | used | 202.0 | — |
| | | 4.0 | | 126.0 | 38.0 |
| | | 0 | fresh | 77.5 | — |
| | | 5.0 | | 105.0 | 35.0 |
| | | 0 | used | 106.5 | — |
| | | 5.0 | | 81.0 | 23.9 |

TABLE II-continued

| Example | Organic Compound | Amount organic compound in solvent-free photopolymer layer (%) | Developer Designation | Clearing Time (sec) | Reduction Clearing Time (%) |
|---|---|---|---|---|---|
| | | 7.8 | | 76 | 28.6 |
| | | 0 | used | 92.5 | — |
| | | 5.0 | | 80.5 | 13.0 |
| | | 7.8 | | 75.5 | 18.4 |
| 6 | 2(a) | 0 | used | 129.5 | — |
| | | 3.0 | | 100.5 | 22.4 |
| | | 5.0 | | 77.0 | 40.5 |
| | | 7.8 | | 65.5 | 49.4 |
| | | 0 | fresh | 72.0 | — |
| | | 3.0 | | 68.0 | 5.6 |
| | | 5.0 | | 53.5 | 25.7 |
| | | 7.8 | | 51.5 | 28.5 |
| 7 | 2(b) | 0 | used | 202.0 | — |
| | | 4.0 | | 132.0 | 35.0 |
| | | 0 | fresh | 77.5 | — |
| | | 5.0 | | 71.5 | 8.0 |
| | | 0 | used | 129.5 | — |
| | | 3.0 | | 98.0 | 24.3 |
| | | 5.0 | | 90.0 | 30.5 |
| | | 7.8 | | 79.0 | 39.0 |
| | | 0 | fresh | 72.0 | — |
| | | 3.0 | | 73.0 | −1.4 |
| | | 5.0 | | 63.5 | 11.8 |
| | | 7.8 | | 64.5 | 10.4 |
| 8 | 2(c) | 0 | used | 202.0 | — |
| | | 4.0 | | 133.0 | 34.0 |
| | | 0 | fresh | 77.5 | — |
| | | 5.0 | | 76.0 | 2.0 |
| | | 0 | used | 129.5 | — |
| | | 3.0 | | 94.5 | 27.0 |
| | | 5.0 | | 96.5 | 25.5 |
| | | 7.8 | | 100 | 22.8 |
| | | 0 | fresh | 72.0 | — |
| | | 3.0 | | 70.0 | 2.8 |
| | | 5.0 | | 73.5 | −2.1 |
| | | 7.8 | | 76.5 | −6.3 |
| 9 | 2(d) | 0 | used | 202.0 | — |
| | | 4.0 | | 134.0 | 34.0 |
| | | 0 | fresh | 77.5 | — |
| | | 5.0 | | 84.0 | −8.0 |
| | | 0 | used | 129.5 | — |
| | | 3.0 | | 100.0 | 23.6 |
| | | 5.0 | | 99.0 | 23.6 |
| | | 7.8 | | 100.5 | 22.0 |
| | | 0 | fresh | 72.0 | — |
| | | 3.0 | | 73.5 | −2.1 |
| | | 5.0 | | 75.5 | −4.9 |
| | | 7.8 | | 73.5 | −2.1 |
| 10 | 3(a) | 0 | used | 109.0 | — |
| | | 4.0 | | 80.0 | 27.0 |
| | | 0 | fresh | 77.5 | — |
| | | 5.0 | | 70.5 | 9.0 |
| 11 (control) | 4(a) | 0 | used | 121.0 | — |
| | | 4.0 | | 133.0 | −9.9 |
| 12 (control) | 4(b) | 0 | used | 121.0 | — |
| | | 4.0 | | 130.0 | −7.4 |
| 13 (control) | 4(c) | 0 | used | 121.0 | — |
| | | 4.0 | | 120.0 | 0.8 |
| 14 (control) | 4(d) | 0 | used | 121.0 | — |
| | | 4.0 | | 115.0 | 5.0 |
| 15 | 4(e) | 0 | used | 104.0 | — |
| | | 1.0 | | 97.0 | 6.7 |
| | | 4.0 | | 72.0 | 31.0 |
| | | 5.5 | | 60.0 | 42.0 |
| | | 0 | used | 104.0 | — |
| | | 4.0 | | 72.0 | 30.8 |
| | | 5.5 | | 60.0 | 42.3 |
| | | 0 | used | 94.0 | — |
| | | 1.0 | | 85.0 | 9.6 |
| | | 2.0 | | 81.0 | 13.8 |
| | | 3.0 | | 73.0 | 22.3 |
| | | 4.0 | | 68.0 | 27.7 |
| | | 0 | used | 121.0 | — |
| | | 4.0 | | 74.0 | 38.9 |
| | | 0 | used | 143.0 | — |
| | | 1.0* | | 113.0 | 14.0 |
| | | 2.0* | | 93.0 | 30.0 |
| | | 4.0* | | 74.0 | 44.0 |
| | | 6.0* | | 57.0 | 57.0 |
| | | 8.0* | | 36.0 | 73.0 |
| | | 10.0* | | 36.0 | 73.0 |
| | | 0 | used | 137.0 | — |
| | | 1.0* | | 112.0 | 18.0 |
| | | 2.0* | | 95.0 | 31.0 |
| | | 4.0* | | 74.0 | 46.0 |
| | | 6.0* | | 59.0 | 57.0 |
| | | 8.0* | | 45.0 | 67.00 |
| | | 10.0* | | 34.0 | 75.0 |
| | | 0 | fresh | 78.0 | — |
| | | 5.0 | | 46.0 | 42.0 |
| | | 10.0 | | 35.0 | 56.0 |
| | | 20.0 | | 32.0 | 59.0 |
| | | 30.0 | | 32.0 | 59.0 |
| | | 40.0 | | 32.0 | 59.0 |
| | | 50.0 | | 30.0 | 61.0 |
| | | 0 | fresh | 77.5 | — |
| | | 5.0 | | 58.0 | 25.0 |
| 16 | 4(f) | 0 | used | 109.0 | — |
| | | 4.0 | | 74.0 | 32.0 |
| | | 0 | fresh | 77.5 | 0 |
| | | 5.0 | | 79.5 | −3.0 |
| 17 | 5 | 0 | used | 109 | — |
| | | 4.0* | | 68 | 38.0 |
| | | 0 | fresh | 77.5 | — |
| | | 5.0 | | 68 | 12.0 |
| | | 0 | fresh | 68.5 | — |
| | | 3.0 | | 64.5 | 6.0 |
| | | 5.0 | | 61.5 | 10.0 |
| | | 7.8 | | 60.0 | 12.0 |
| 18 | 6(a) | 0 | used | 199.0 | — |
| | | 4.0 | | 138.0 | 31.0 |
| | | 0 | fresh | 77.5 | — |
| | | 5.0 | | 76.5 | 1.0 |
| | | 0 | fresh | 68.5 | — |
| | | 3.0 | | 71.5 | −4.0 |
| | | 5.0 | | 69.5 | −2.0 |
| | | 7.8 | | 67.0 | +2.0 |
| 19 | 6(b) | 0 | used | 199.0 | — |
| | | 1.0 | | 162.0 | 19.0 |
| | | 0 | fresh | 68.5 | — |
| | | 3.0 | | 74.5 | −9.0 |
| | | 5.0 | | 78.5 | −15.00 |
| | | 7.8 | | 80.5 | −18.0 |
| 20 | 7 | 0 | used | 199.0 | — |
| | | 4.0 | | 137.0 | 31.0 |
| | | 0 | fresh | 77.5 | — |
| | | 5.0 | | 66.5 | 14.00 |
| 21 | 8 | 0 | used | 199.0 | — |
| | | 4.0 | | 144.0 | 28.0 |
| | | 0 | fresh | 77.5 | — |
| | | 5.0 | | 85.0 | −10.0 |
| 22 | 9 | 0 | used | 199.0 | — |
| | | 4.0 | | 128.0 | 36.0 |
| | | 0 | fresh | 77.5 | — |
| | | 5.0 | | 72.0 | 7.0 |

*organic compound added in addition to monomer

EXAMPLE 23

A stock solution containing the following components is prepared as described in Examples 2 to 22:

| Components | Amount (g) |
|---|---|
| Methylene chloride | 218.0 |
| Methanol | 10.0 |
| 2-Ethoxyethanol | 2.0 |
| Styrene-maleic anhydride (1:1) isobutyl ester, (mol. wt. 20,000) | 31.3 |
| Terpolymer: methylmethacrylate | 31.3 |

| Components | Amount (g) | |
|---|---|---|
| (71), ethyl acrylate (17), acrylic acid (12) (mol. wt. 200,000) | 5 | |
| Trimethylolpropane triacrylate | 10.3 | |
| Poly(oxyethyl) trimethylolpropane triacrylate | 15.0 | |
| 2,2′Bis(o-chlorophenyl)-4,4′,5,5′-tetraphenylbiimidazole | 3.8 | |
| Michler's ketone | 0.20 | |
| Sodium bis(2-ethylhexyl) sulfosuccinate | 4.0 | |
| 2-Mercaptobenzoxazole | 0.60 | |
| Poly(ethylene/propylene glycol) (mol. wt. 3200) | 3.0 | |
| Tris(4,4′,4″-dimethylaminophenyl) methane | 0.10 | |
| Benzotriazole | 0.40 | |
| 1,4,4-trimethyl-2,3-diazabicyclo-[3.2.2]-non-2-ene-N,N—dioxide | 0.08 | |
| Victoria Green Dye, CI Basic Green 4 | 0.03 | |

A control stock solution is also prepared as described above except that no sodium bis(2-ethylhexyl)sulfosuccinate is added and 14.3 grams of trimethylolpropane triacrylate are present.

The solution are coated, dried and laminated as described in Examples 2 to 22. After removal of the cover sheet, the films are hot roll laminated also as described in the previous examples. The support is removed and the clearing time necessary to dissolve the unexposed image areas from the upper panel is measured visually in a processor as described in Examples 2 to 22 with a similar aqueous developer. The control clears in 45 seconds whereas the element of the invention clears in 25 seconds.

We claim:

1. An aqueous developable photopolymerizable element comprising a support bearing at least one layer of a photopolymerizable composition consisting essentially of
    (a) at least one nongaseous ethylenically unsaturated compound capable of forming a high polymer by free-radical initiated chain propagating addition polymerization;
    (b) at least one organic acid polymeric binder soluble in solely aqueous alkaline solvent devoid of organic solvents;
    (c) an organic, radiation-sensitive, free-radical generating photoinitiator or photoinitiator system taken from the class consisting of polynuclear quinones, vicinal ketaldonyl alcohols, acyloin ethers, alpha-hydrocarbon-substituted aromatic acyloins, photoreducible dyes and reducing agents including dyes of the phenazine, oxazine and quinone classes, Michler's ketone, benzophenone, 2,4,5-triphenylimidazolyl dimers with hydrogen donors, and mixtures, and
    (d) at least 4.0% by weight based on the weight of solids in the photopolymerizable composition of an organic compound or salt of an organic compound taken from the group consisting of
    (1)

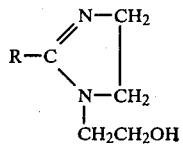

wherein R is an alkyl chain with 7 to 17 carbon atoms (2)

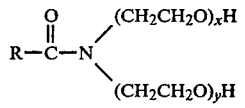

wherein R is $CH_3(CH_2)_7CH=CH(CH_2)_8-$, or a mixture of alkyl chains with 16 and 18 carbon atoms and $CH_3(CH_2)_7CH=CH(CH_2)_8-$, and $x+y$ is 2 to 10;

(3)

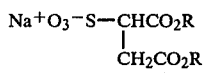

wherein R is a straight or branched alkyl chain of 8 to 13 carbon atoms;

(4)

wherein R is an alkyl chain with 1 to 9 carbon atoms;

(5)

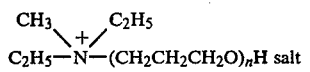

wherein n is 10 to 50;

(6)

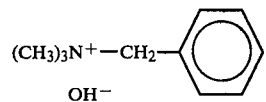

(7) $C_{16}H_{33}N(CH_3)_3{}^+Br^-$;
(8) $RNH\ CH_2CH_2COO^-Na^+$ wherein R is an alkyl group derived from coconut oil; and combinations thereof.

2. An aqueous developable photopolymerizable element comprising a support bearing at least one layer of a photopolymerizable composition consisting essentially of
    (a) at least one nongaseous ethylenically unsaturated compound capable of forming a high polymer by free-radical initiated chain propagating addition polymerization;
    (b) at least one organic acidic polymeric binder soluble in solely aqueous alkaline solvent devoid of organic solvents;

(c) an organic, radiation-sensitive, free-radical generating photoinitiator or photoinitiator system taken from the class consisting of polynuclear quinones, vicinal ketaldonyl alcohols, acyloin ethers, alpha-hydrocarbon-substituted aromatic acyloins, photoreducible dyes and reducing agents including dyes of the phenazine, oxazine and quinone classes, Michler's ketone, benzophenone, 2,4,5-triphenyl-imidazolyl dimers with hydrogen donors, and mixtures, and (d) at least 4.0% by weight based on the weight of solids in the photopolymerizable composition of an organic compound of the formula

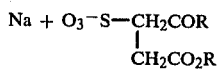

wherein R is a straight or branched alkyl chain of 8 to 13 carbon atoms.

3. A photopolymerizable element according to claim 2 wherein the organic compound is sodium bis-(2-ethylhexyl)sulfosuccinate.

4. An aqueous developable photopolymerizable element comprising a support bearing at least one layer of a photopolymerizable composition consisting essentially of (a) at least one nongaseous ethylenically unsaturated compound capable of forming a high polymer by free-radical initiated chain propagating addition polymerization;

(b) at least one organic acidic polymeric binder soluble in solely aqueous alkaline solvent devoid of organic solvents;

(c) an organic, radiation-sensitive, free-radical generating photoinitiator or photoinitiator system taken from the class consisting of polynuclear quinones, vicinal ketaldonyl alcohols, acylonin ethers, alpha-hydrocarbon-substituted aromatic acyloins, photoreducible dyes and reducing agents including dyes of the phenazine, oxazine and quinone classes, Michler's ketone, 2,4,5-triphenyl-imidazolyl dimers with hydrogen donors, and mixtures, and (d) at least 4.0% by weight based on the weight of solids in the photopolymerizable composition of an organic compound of the formula

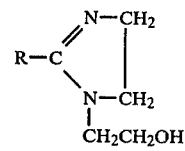

wherein R is an alkyl chain with 7 to 17 carbon atoms.

5. A photopolymerizable element according to claim 4 wherein R is an alkyl of 7 carbon atoms.

6. A photopolymerizable element according to claim 1 wherein the photopolymerizable layer is adhered to a copper support.

* * * * *